(12) United States Patent
Pashmakov

(10) Patent No.: US 6,859,390 B2
(45) Date of Patent: *Feb. 22, 2005

(54) PHASE-CHANGE MEMORY ELEMENT AND METHOD OF STORING DATA THEREIN

(75) Inventor: Boil Pashmakov, Troy, MI (US)

(73) Assignee: Ovonyx, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/755,169

(22) Filed: Jan. 9, 2004

(65) Prior Publication Data
US 2004/0145944 A1 Jul. 29, 2004

Related U.S. Application Data

(63) Continuation of application No. 10/252,628, filed on Sep. 23, 2002.

(51) Int. Cl.[7] ................................................ G11C 11/00
(52) U.S. Cl. .................... 365/163; 365/113; 365/100
(58) Field of Search ................................ 365/163, 113, 365/100

(56) References Cited

U.S. PATENT DOCUMENTS 6,487,113 B1 * 11/2002 Park et al. .................. 365/163
6,590,807 B2 * 7/2003 Lowrey ...................... 365/175

* cited by examiner

Primary Examiner—Huan Hoang
(74) Attorney, Agent, or Firm—Philip H. Schlazer; Marvin S. Siskind (57) ABSTRACT

A phase-change memory element including a phase-change material. The phase-change memory element has a plurality of memory state wherein each of the memory states has a corresponding threshold voltage. The threshold voltages may be used to determine the current memory state of the memory element. The phase-change material may include a chalcogen element.

21 Claims, 5 Drawing Sheets

R-I Curve

FIG - 8
PRIOR ART

Threshold Voltage vs. Current

PHASE-CHANGE MEMORY ELEMENT AND METHOD OF STORING DATA THEREIN

RELATED APPLICATION INFORMATION

This application is a continuation of U.S. patent application Ser. No. 10/252,628, filed on Sep. 23, 2002. U.S. patent application Ser. No. 10/252,628 is hereby incorporated by reference herein.

FIELD OF THE INVENTION

The present invention relates generally to electrically programmable, phase-change memory elements and more particularly to a method for data storage in the phase-change memory elements.

BACKGROUND OF THE INVENTION

Programmable phase-change memory elements formed from materials that can be programmed to exhibit at least two detectably distinct electrical resistivities are known in the art. Phase-change materials may be programmed between a first structural phase where the material is generally more amorphous and a second structural phase where the material is generally more crystalline. The term amorphous as used herein, refers to a condition that is relatively structurally less ordered or more disordered than a single crystal and has a detectable characteristic, such as high electrical resistivity. The term crystalline, as used herein, refers to a condition that is relatively structurally more ordered than amorphous and has lower electrical resistivity than the same material has in the amorphous phase. Since memory elements made with a phase-change material can be programmed to a high resistance state or a low resistance state by changing the phase of the material, one phase can be used to store a logic 0 data bit, for example, while the other is used to store a logic 1 data bit.

A single pulse of energy referred to as a set pulse can be used to transform a volume of phase-change material from the high resistance, amorphous phase, to the low resistance, crystalline phase. Similarly, a single pulse of energy referred to as a reset pulse can be used to transform the volume of phase-change material from the crystalline phase to the amorphous phase. Each phase is non-volatile, i.e., stable, and has characteristic differences that are measurable, such as the change in resistance previously noted.

Electrical resistivity, however, is only one property that changes with a set or a reset of the phase-change material. For example, optical reflectivity also changes with the phase of the material. These changes result because the amorphous-to-crystalline transition is accompanied by discontinuous changes in the volume, density, thermal expansion co-efficient and other material parameters of the phase-change material. Due to these discontinuous changes in the phase-change material, operating the memory device in a phase-change mode is prone to failures. For example, one potential structural failure resulting from the discontinuous changes of the phase-change material is delamination of the phase-change material from the contacts of a memory device, particularly when operating at high frequencies and with high cycling. These types of problems are typically solved by thermal engineering of the structure of the memory element in an effort to minimize stress during operation. Another design solution is selecting suitable contacts to the phase-change material. Both of these solutions require careful engineering of the boundary conditions and interfaces to be manufactured into the memory element.

SUMMARY OF THE INVENTION

In one aspect of the present invention, a data storage capability is provided using memory elements of phase-change material that operate entirely within one phase, thus avoiding the problems associated with discontinuous changes. Performing only microscopic and gradual changes within a single phase minimizes structural failures such as delamination, without additional engineering of the memory element structure. By operating in the amorphous, or reset, phase, another memory element failure, failure to set (i.e., convert to the crystalline phase) upon receipt of a set pulse, can also be prevented. In addition, the amorphous phase requires low programming energy compared to the crystalline phase.

One aspect of the present invention, therefore, is a method of data storage using a phase-change memory element operating in an amorphous phase. The memory element has a threshold voltage variable with a programmed resistance of the memory element. The threshold voltage is where the phase-change material starts exhibiting negative conductivity, that is, the phase-change material moves from the stable amorphous phase to an unstable electrical region where current increases but voltage decreases. The method includes a step of applying a voltage potential across a memory element programmed to one resistance state of a plurality of detectably distinct resistance states. The voltage potential is a discriminating voltage that is greater than or less than the threshold voltage of the programmed memory element. The method also includes the steps of preventing a current higher than a limiting current from flowing across the memory element if the discriminating voltage is greater than the threshold voltage and determining the resistance state of the memory element using a level of current flowing across the memory element.

Another aspect of the present invention is a method of operating a phase-change memory element, the memory element including a phase-change material, the method comprising the step of: programming the phase-change material between at least a first resistance state and a second resistance state without making an amorphous to crystalline phase transition. Preferably, the first resistance state corresponds to a first modification of an amorphous phase and the second resistance state corresponds to a second modification of the amorphous phase.

Other variations of the method of the present invention are contemplated and are described in detail herein.

BRIEF DESCRIPTION OF THE DRAWINGS

The various features, advantages and other uses of the invention will become more apparent by referring to the following detailed description and drawing in which.

DETAILED DESCRIPTION OF THE INVENTION

Figure 1:
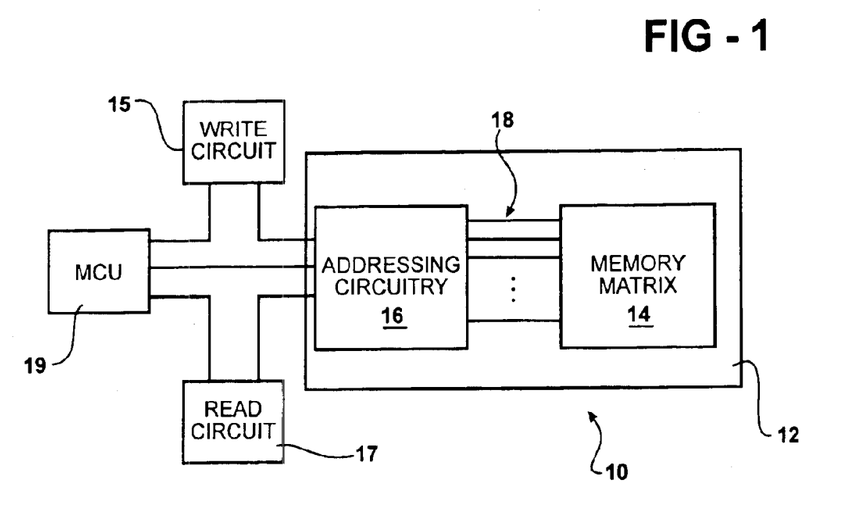
FIG. 1 is a high-level diagram of a memory device including addressing and control circuitry and a memory array incorporating programmable resistance memory elements.

Programmable resistance memory elements comprise a volume of phase-change memory material that is programmable between an amorphous phase and a crystalline phase by application of set and reset pulses as previously described. The pulses can originate from any type of energy source such as particle beam energy, optical energy, thermal energy, electromagnetic energy, acoustical energy, pressure energy, etc. The amorphous phase is a relatively high resistance state, while the crystalline phase is a relatively low resistance state. FIG. 1 shows individual programmable resistance memory elements (shown in FIG. 2) combined into a memory array, or matrix, 14 in a data storage, or memory, device 10. The memory device 10 includes a plurality of memory cells 20 for storing data. The memory matrix 14 is an integrated circuit memory array 14 mounted on a substrate 12 and is coupled to addressing circuitry 16 by the plurality of control lines 18. The addressing circuitry 16 is often fabricated upon the same substrate 12, as shown, and includes circuitry for addressing the memory cells 20.

In some applications, the addressing circuitry 16 may include circuitry for storing data in and retrieving data from the memory cells 20 and may also include other circuitry used for controlling or otherwise ensuring the proper functioning of the memory device 10. In this application, however, separate circuits are shown for these functions. More specifically, a write circuit 15 is coupled to the addressing circuitry 16 and a read circuit 17 is similarly coupled to the addressing circuitry 16. These circuits 15, 17 could be integrated circuits, but are more likely discrete components. A processor 19 is coupled to each circuit 15, 16 and the addressing circuitry 16. The processor 19 shown is a microcontroller (MCU), but the processor 19 can be any device capable of executing an operating program and directing output signals and receiving input signals. Thus, the processor 19 can be a microprocessor unit.

Figure 2:
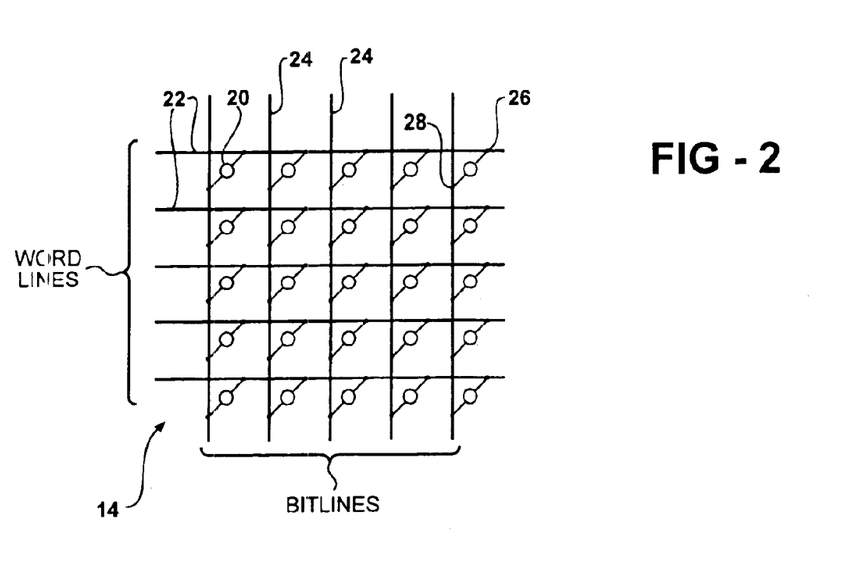
FIG. 2 is a schematic diagram of a memory array according to FIG. 1.

A schematic diagram of the memory array 14 is shown in FIG. 2. As can be seen, the memory array 14 includes a plurality of memory cells 20 arranged in generally perpendicular rows and columns. The memory cells 20 in each row are coupled together by a respective wordline 22, and the memory cells 20 in each column are coupled together by a respective bitline 24. More specifically, each memory cell 20 includes a wordline node 26 that is coupled to a respective wordline 22, and each memory cell 20 includes a bitline node 28 that is coupled to a respective bitline 24. The conductive wordlines 22 and bitlines 24 are electrically coupled to the addressing circuitry 16 (shown in FIG. 1) through the control lines 18 so that each of the memory cells 20 can be accessed for the storage and retrieval of information.

Returning now to FIG. 1, the processor 19 generally sends a plurality of operating signals according to an operating program to write data to or read data from the individual memory cells 20 of the memory matrix 14. These operating signals, as are known in the art, generally comprise an address line coupled to data lines, along with a bit indicating whether a read or a write is to occur. The address line contains a wordline 22 and a bitline 24, indicating which particular memory cell 20 is to be addressed. By methods known by those skilled in the art, the processor 19 controls the write circuit 15 and the addressing circuitry 16 to write data from the data lines associated with an address line to the addressed memory cell 20 upon occurrence of a write bit in an operating signal. Similarly, the processor 19 controls the read circuit 17 and the addressing circuitry 16 to read data onto data lines associated with an address line from the addressed memory cell 20 upon occurrence of a read bit in an operating signal.

Although the simple configuration shown in FIG. 1 is used for illustrative purposes, it will be clear that other configurations are possible. For example, the memory matrix 14 and the addressing circuitry 16 of the memory device 10 are not necessarily on a common semiconductor substrate 12. The matrix 14 and circuitry 16 could each be one or more separate integrated circuits electrically coupled on one or more circuit boards. As another example, the write circuit 15 and the read circuit 17 could be coupled to the memory matrix 14 directly through the control lines 18 instead of coupled to the addressing circuitry 16 as shown. Yet another variation can exist whereby some or all of the functions performed by the write circuit 15 and the read circuit 17 are performed by the processor 19. It is further noted that with respect to FIG. 2, the size of the memory array 14, i.e., the number of wordlines 22 and bitlines 24, is not limited to any particular number of rows or columns and is provided as an example only.

Figure 3:
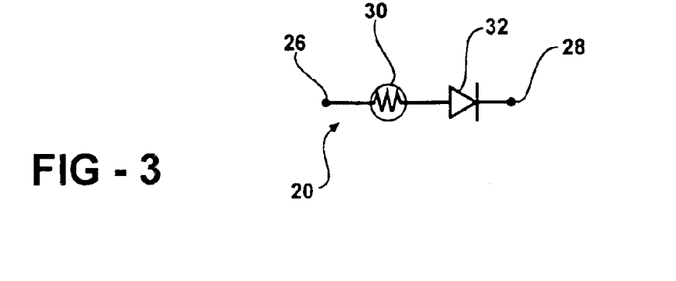
FIG. 3 is a schematic diagram of a memory cell incorporating a memory element and an isolation device.

FIG. 3 illustrates an exemplary memory cell 20 that may be used in the memory array 14. The memory cell 20 includes a memory element 30 coupled to an address/isolation device 32 that electrically isolates each memory element 30 from all other memory elements 30 in the array 14. The isolation devices 32 thus permit each discrete memory cell 20 to be read and written to without interfering with information stored in adjacent or remote memory cells 20 of the array 14. While the isolation device 32 is shown as a diode 32 in FIG. 3, the memory elements 30 may incorporate any type of isolation/addressing device. Another device that can be used in place of the diode 32 includes a transistor, such as a bipolar junction transistor and any type of field-effect transistor (FET) such as a junction FET (JFET) and a metal oxide semiconductor FET (MOSFET). The memory element 30 is a programmable resistive phase-change element preferably made of a chalcogen and other materials. As illustrated in FIG. 3, the memory element 30 is coupled to a wordline 22 at a wordline node 26, and the diode 32 is coupled to a bitline 24 at a bitline node 28. However, it should be understood that these connections of the memory cell 20 may be reversed without adversely affecting the operation of the memory array 14. Phase-change materials and electrically programmable memory elements formed from such materials are disclosed in more detail in, for example, U.S. Pat. Nos. 5,166,758, 5,296,716, 5,414,271, 5,359,205 and 5,534,712, the disclosures of which are each incorporated herein by reference.

As seen from FIG. 3, the isolation device 32, in this case a diode, isolates the memory element 30 such that if a voltage applied to the wordline node 26 is greater than a voltage applied to the bitline node 28, there will be a potential difference across the memory element 30 and current will flow through the memory element 30. In this manner, the memory elements 30 can be written to and read from as described herein. Although the invention is described with reference to reading from and writing to one memory element 30, the invention can be directed to an array 14 wherein a plurality of memory cells 20 are read at one time, which variation is within the level of skill of one in the art.

Although phase-change materials have been described as having two phases, amorphous and crystalline, phase-change materials may also be programmed between different detectable phases of local order across the entire spectrum between these amorphous and crystalline phases. That is, the programming of such materials is not required to take place between the two phases, either amorphous or crystalline, but rather the material can be programmed in incremental steps reflecting either changes of local order of the phase-change material or changes in volume of two or more phase-change materials having different local order. These incremental changes provide a gray scale represented by a multiplicity of conditions of local order spanning the spectrum between the amorphous and the crystalline phases.

Experimental evidence indicates that between one and two orders of magnitude of the resistivity of a phase-change material can be achieved within its amorphous phase alone as incremental changes to the material are made. The present invention takes advantage of this capability of phase-change materials by operating the materials in only their amorphous phase, while still maintaining at least two resistance states.

More specifically, since between one and two orders of magnitude of resistivity are associated with the gray scale of conditions in the amorphous phase, a range of magnitudes at one end of the gray scale can be said to correspond to a first resistance state, while a separate range of magnitudes at the other end of the gray scale can be said to correspond to a second resistance state. With at least two resistance states, a memory element can store at least one bit of information. Depending upon a variety of factors described in more detail herein, the phase-change material may be programmable such that the memory element 30 stores more than one bit of information in its amorphous phase. For example, phase-change material programmable to at least four resistance states makes a memory element 30 capable of storing at least two bits of information. The memory elements 30 are programmable by selectively applying energy pulses, and preferably electrical current pulses, of appropriate amplitudes and pulse widths as described in further detail herein. To distinguish the energy pulses that can program the memory element 30 to these amorphous phase resistance states as opposed to the set and reset pulses previously described, these pulses are hereinafter referred to as programming pulses.

Another difference between the amorphous and crystalline phases, besides resistivity, is the presence in the reset state, i.e., the amorphous phase, of a threshold voltage. A threshold voltage is a voltage level at which the phase-change material moves out of the stable amorphous phase and starts exhibiting negative conductivity. In this unstable electrical region, current increases but voltage decreases. Such a threshold voltage does not exist where the phase-change material is in its set state, i.e., its crystalline phase. The threshold voltage increases along with the programmed resistance of the memory element 30. As described herein, the present invention takes advantage of this fact in reading the data, i.e., the resistance, of the memory element 30.

The method of data storage according to the present invention is described with further reference to FIGS. 4–10.

Figures 4, 5:
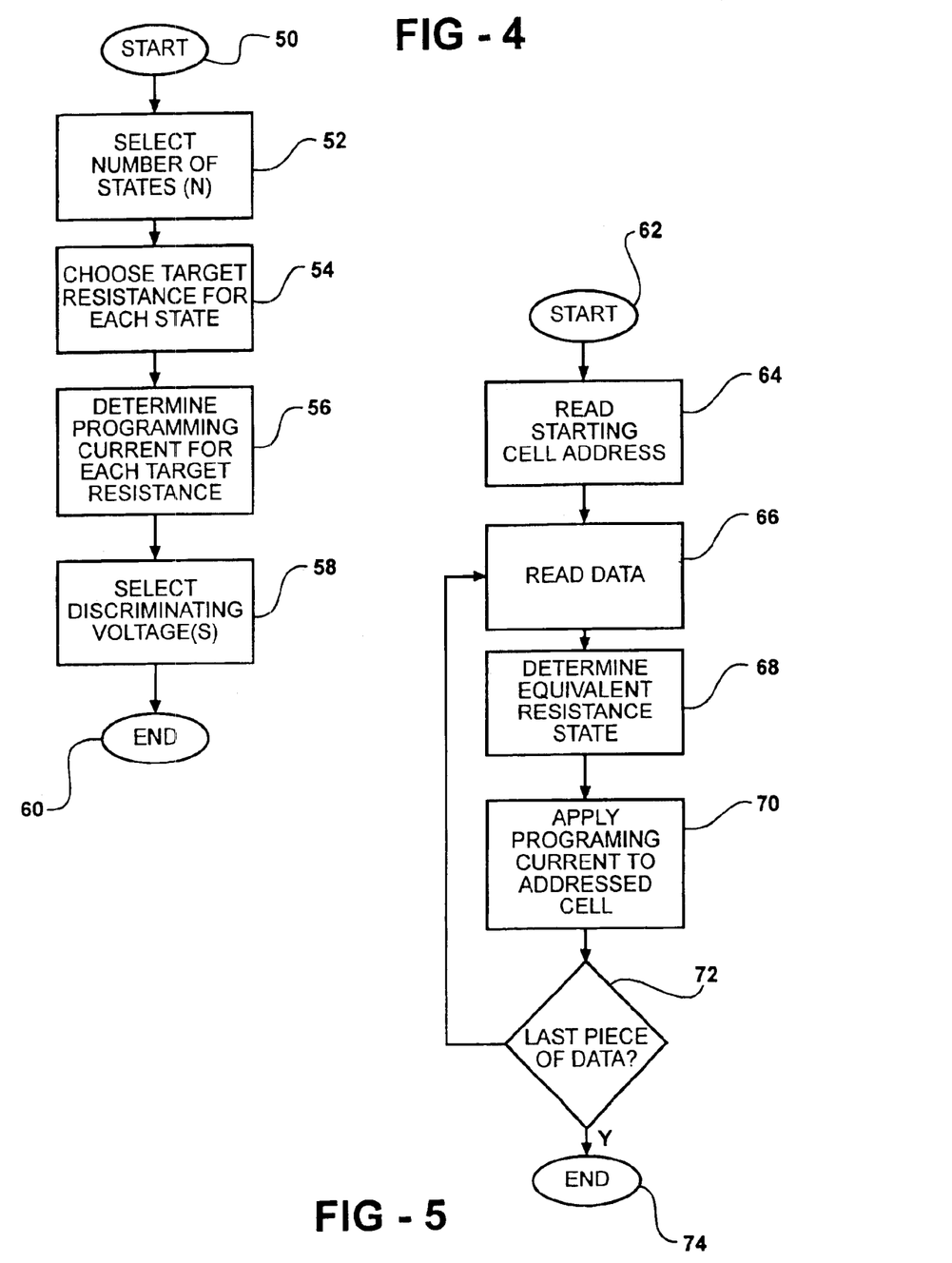
FIG. 4 is a block diagram of an initialization subroutine according to the method of the present invention.
FIG. 5 is a block diagram of a write subroutine according to the method of the present invention.

FIG. 4 shows the initialization subroutine for the method, which starts at step 50. The subroutine proceeds to step 52 where the number of states N is selected and then proceeds to step 54 where a target resistance for each state is chosen. Although these steps are shown separately, to a large extent they overlap because the number of available target resistance values limit the number of states. More specifically, the number of states that can be programmed within the amorphous phase is dependent upon the range and predictability of the resistance values experienced by the phase-change material of a memory element 30 as local order incremental changes occur in the amorphous phase. A memory element 30 should be programmable such that, for any given programming pulse selected to program a memory element 30, the resulting resistance, when read, indicates only one state. In other words, any resistance value for a memory element 30 resulting from a programming pulse should not lie in more than one state. Generally, the wider the range of resistance values experienced by the phase-change material, the higher the number of states that can be stored in a single memory element 30. However, the predictability of the resistance values experienced by a memory element 30 is even more important to the number of states.

Figure 7:
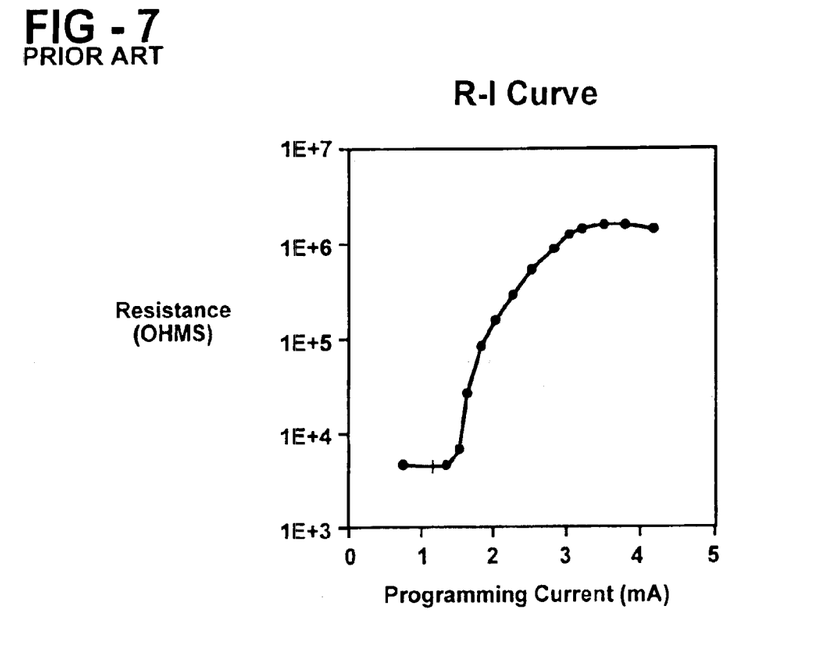
FIG. 7 is a graph of resistance versus programming current in the amorphous phase.

FIG. 7 is a graph showing the resistance for a typical programmable resistance memory element 30 according to the description contained in U.S. Pat. No. 5,166,758 where current is used for the programming pulses. A different composition for the phase-change material may, of course, change this relationship between resistance and current. In fact, the presence of even small variations in the construction of memory elements 30 including the same composition of phase-change material can result in variations in the resistance programmed to a memory element 30 from that indicated in the graph for any chosen programming current. This is not a problem when only one memory element 30 is being used for data storage because the relationship between resistance and programming pulses is discoverable by experiment, and the relationship remains relatively unchanged for the useful life of the memory element 30. However, in data storage applications using a memory array 14 containing a plurality of memory elements 30 incorporated in memory cells 20, each of the plurality of memory elements 30 may store a slightly different resistance value for a unique programming pulse. This means that each state must be represented by a range of resistance values in order to account for non-uniformity in memory elements 30.

Another factor making it desirable to have a range of resistance values represent a single state is inaccuracies in reading the actual resistance value stored in a memory element 30. Accurate reading of a resistance value can require additional circuitry such as the reference cells described in U.S. Pat. No. 6,314,014, the disclosure of which is incorporated herein by reference. In addition, the more precise a reading, the more time-consuming it is to obtain. In data storage applications, speed is desirable, and accuracy can suffer as a result.

Since between one and two orders of magnitude of resistivity are associated with the gray scale of conditions in the amorphous phase as described herein, a memory element 30 can easily accommodate two states in step 52. The target resistance for each state can be chosen in step 54 such that a range of magnitudes at one end of the gray scale can be said to correspond to a first resistance state, while a separate range of magnitudes at the other end of the gray scale can be said to correspond to a second resistance state. As shown in FIG. 7, for example, programming pulses of 1.8–2.8 milliamperes (mA) correspond to resistance values between 100 kilo-ohms (kΩ) and 1 Mega-ohm (M). This region is the region of the graph where the threshold voltage previously described varies linearly with the programmed resistance of the phase-change material, the importance of which is described in more detail herein. In step 52, each of the states is also assigned a value depending upon the number system desired. For example, in a binary system the first resistance state can be said to correspond to a logic 0 data bit, while the second resistance state can be said to correspond to a logic 1 data bit.

If the number of states N chosen in step 52 is two states, then the target resistance values for each state chosen in step 54 using the graph of FIG. 7 can be, by example, a first target resistance of 100 kΩ and a second target resistance of 1 MΩ. Given the large difference between these two resistance values, there is little chance of a properly applied programming pulse intended to program the memory element 30 to one resistance resulting in an actual resistance value far enough off so that the state of the memory element 30 is misread. Of course, the target resistance values chosen can be closer together, but with only two states, this is not necessary. Arbitrarily, the low target resistance of 100 kΩ is in the first resistance state herein, and the high target resistance of 1 MΩ is in the second resistance state.

In step 56, a programming pulse is determined for each target resistance chosen in step 54. As shown in FIG. 7 and described herein, electrical energy in the form of electrical current applied across the memory element 30 is used as the programming pulse. However, the programming pulse can originate from any type of energy source that can perform the desired change to the phase-change material in its amorphous phase to obtain the target resistance. Thus, like the set and reset pulses mentioned earlier, the energy source can be particle beam energy, optical energy, thermal energy, electromagnetic energy, acoustical energy, pressure energy, etc. In the example under discussion, a programming pulse with a magnitude of about 1.8 mA programs the memory element 30 to the target resistance of 100 kΩ, representing the first resistance state, while a programming pulse of about 2.8 mA programs the memory element 30 to the target resistance of 1 MΩ, representing the second resistance state.

Figure 6:
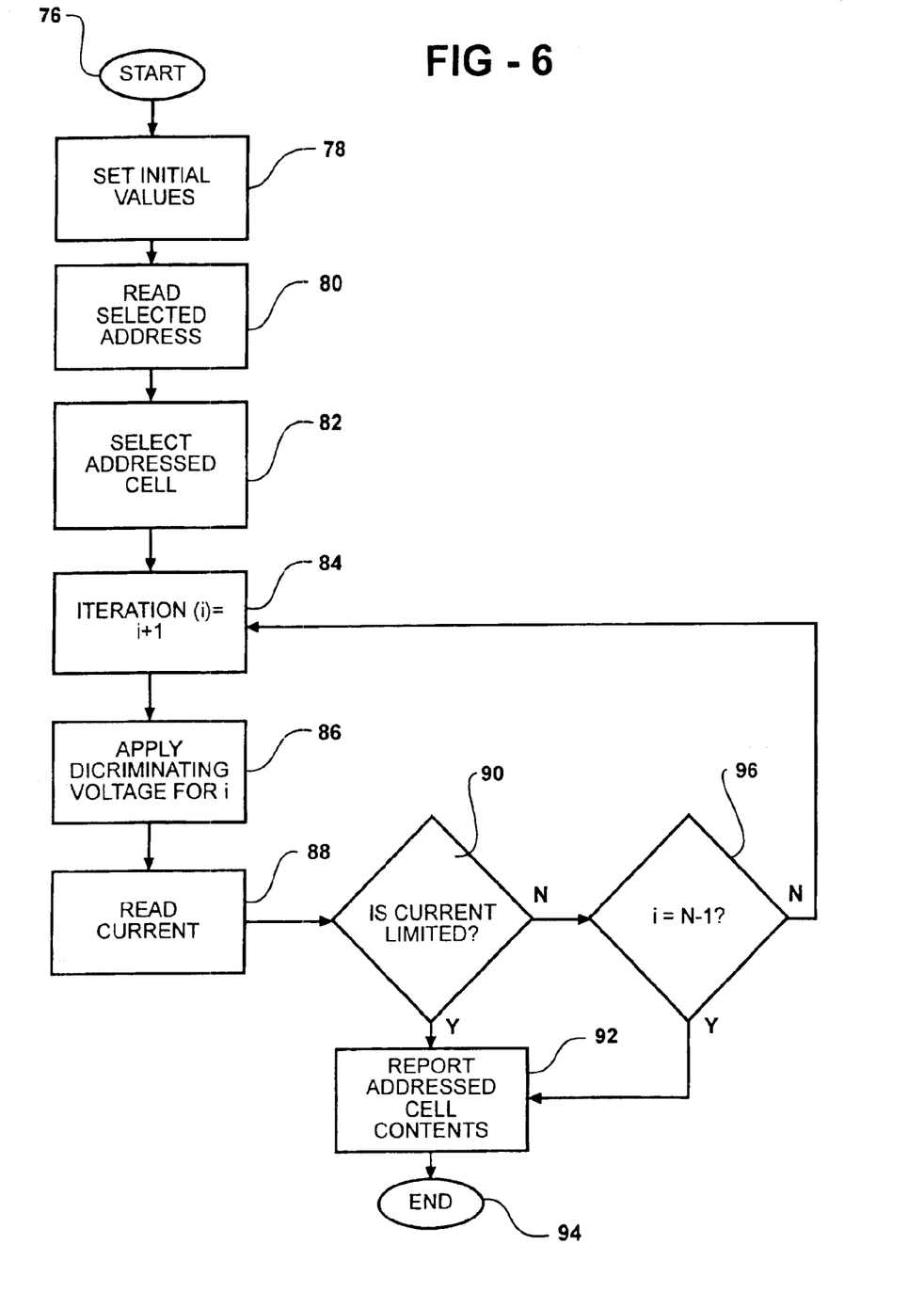
FIG. 6 is a block diagram of a read subroutine according to the method of the present invention.

The next step in the initialization subroutine shown in FIG. 4 is to select one or more discriminating voltages for use in the read subroutine, as discussed in more detail herein with respect to FIG. 6. The discriminating voltage(s) are selected based upon two factors, the number of states and the threshold voltage Vth. First, the discriminating voltage(s) are selected to discriminate between resistance levels. One discriminating voltage distinguishes between two states. Thus, in a memory element 30 where one of two states can be programmed, only one discriminating voltage is needed. Where four states can be programmed, for example, three discriminating voltages are used.

Figure 8:
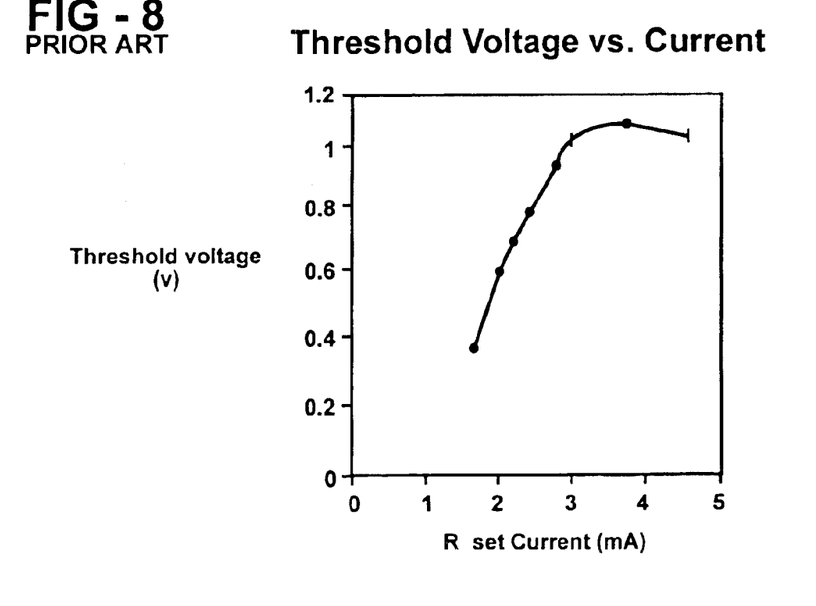
FIG. 8 is a graph of threshold voltage versus reset current in the amorphous phase.

The second variable in selecting the one or more discriminating voltages is the value for the threshold voltage Vth when a memory element 30 is programmed at a target resistance within the amorphous phase. In the region where the resistance changes from 100 kΩ to 1 MΩ, as shown for the memory element 30 of FIG. 7, the threshold voltage increases linearly for at least a portion of the resistance change from about 0.5 volts to just under 1.0 volts with an applied reset current, as shown in FIG. 8. Although reset current is used in FIG. 8, while programming current is used in FIG. 7, these two quantities are essentially the same. The linear portion of the relationship between the programmed resistance R and the threshold voltage Vth is governed by the relationship Vth=(2E-06)R+0.3184, but saturation of the memory element 30 causes non-linearity as the impedance reaches 1 MΩ. Thus, while a memory element 30 programmed to 100 kΩ will have a threshold voltage Vth of about 0.5 volts (V), a memory element 30 programmed to 1 MΩ will only have a threshold voltage Vth of about 1.0 V. Of course, changes in the phase-change material of the memory element 30 or the construction of the memory element 30 can change these relationships between threshold voltage, current and programmed resistance.

In the example, one discriminating voltage of 0.75 volts is appropriate, being midway between 0.5 V and 1.0 V. The use of the discriminating voltage(s) to determine the state of the memory element 30 will be described hereinafter with respect to FIG. 6. The initialization subroutine ends at step 60.

FIG. 5 shows an exemplary write subroutine that may be implemented according to the method according to the present invention when a plurality of memory elements 30 are incorporated in an array 14. Of course, some changes in the exemplary write subroutine are made to accommodate different arrangements and numbers of memory elements 30, which changes are within the level of skill in the art provided with the teachings herein. When data is referred to as written to or read from a memory cell 20 herein, it means that the data is written to or read from the associated memory element 30. The subroutine starts at step 62 and proceeds to step 64 where the processor 19 reads the starting address contained in a write command. The starting address is the address of the first memory cell 20 to which data is to be written. The write command can be issued to the processor 19 from, for example, an operating program. In step 66, processor 19 begins reading the data to be written to the memory cells 20 starting at the memory cell 20 at the starting address. The data of course can be data in any number system including binary, binary coded decimal (BCD), octal, hexadecimal, etc. The bit(s) of data to be stored individually by each memory cell 20 are called write data herein.

In step 68, the processor 19 next determines the resistance state equivalent to the write data for the memory cell 20 at the starting address. For simplicity, the examples herein will assume that the data is a string of binary numbers. Thus, in a system where the number of states N=2, the write data for the memory cell 20 is a data bit of [1] or [0]. In a two-bit binary system, i.e., one where the number of states N=4, the write data is [00], [01], [10] or [11]. In the two-state example, the first resistance state was assigned a 0 data bit in step 52, while the second resistance state was assigned a 1 data bit. Thus, if the write data is a 0 data bit, the low resistance of the first resistance state is to be programmed to the memory cell 20 at the starting address. On the other hand, if the write data is a 1 data bit, the high resistance of the second resistance state is to be programmed to the memory cell 20 at the starting address.

The write subroutine next proceeds to step 70 where the proper programming pulse is applied to the addressed memory cell, here the memory cell 20 at the starting address. Using known data, a programming pulse able to program the memory element 30 to the resistance associated with the write data for the addressed memory cell 20. For example, using the curve of FIG. 7 and the two-state example associated with it, if the write data is a logic 0 data bit, a programming pulse of 1.8 mA is applied across the memory cell 20 indicated by the address line. In contrast, if the write data is a logic 1 data bit, a programming pulse of 2.8 mA is applied across the memory cell 20 indicated by the address line. Although the amplitude of the programming pulse when using current is important, the width of the programming pulse applied in step 70 is not. In fact, there is no lower limit imposed upon the current pulse width. For example, a programming current pulse with a width of about 30 nanoseconds can be used.

After the programming pulse is applied in step 72, the memory cell 20 is programmed. The write subroutine then proceeds to step 72, where it is determined whether additional data associated with the starting address exists, indicating that write data exists for at least one memory cell 20 after the memory cell 20 at the starting address. If the end of the data has been reached in step 72, the write subroutine ends at step 74 for that write command of the processor 19. If, however, the end of data has not been reached in step 72, the write data for the next memory cell 20 is read in step 66. The steps continue in turn as previously described until the last piece of data has been read in step 72. The write subroutine then ends at step 74 for that write command of the processor 19. After the write subroutine ends in step 74, the write subroutine of FIG. 5 is executed again by the processor 19, or the read subroutine of FIG. 6 or some other command is executed by the processor 19. Although the write subroutine is described as sequentially writing to memory cells 20 when a plurality of memory cells 20 are addressed, this is not necessary. The memory cells 20 can be written in any order and can, in some cases, be written to simultaneously.

As mentioned, the pulse width of a current programming pulse can be very narrow. This can result in fast programming with low power of a plurality of memory elements 30, providing a benefit to applications incorporating the memory elements 30, such as the use of the memory elements 30 in memory cells 20 of the array 14. Another benefit of the present invention is that the programming pulses not only correspond to a single value of threshold voltage and programmed resistance, but that they also over-write the prior value programmed to the memory element 30. That is, a programming pulse applied in step 70 will change the phase-change material to the new target resistance value associated with the programming pulse, regardless of where the starting point of the resistance (and the phase-change material) was prior to the application of the programming pulse, as long as the phase-change material is in its amorphous phase. Thus, a subsequent write command from the processor 19 can over-write data written in a prior write subroutine, such as that shown in FIG. 5.

Figure 9:
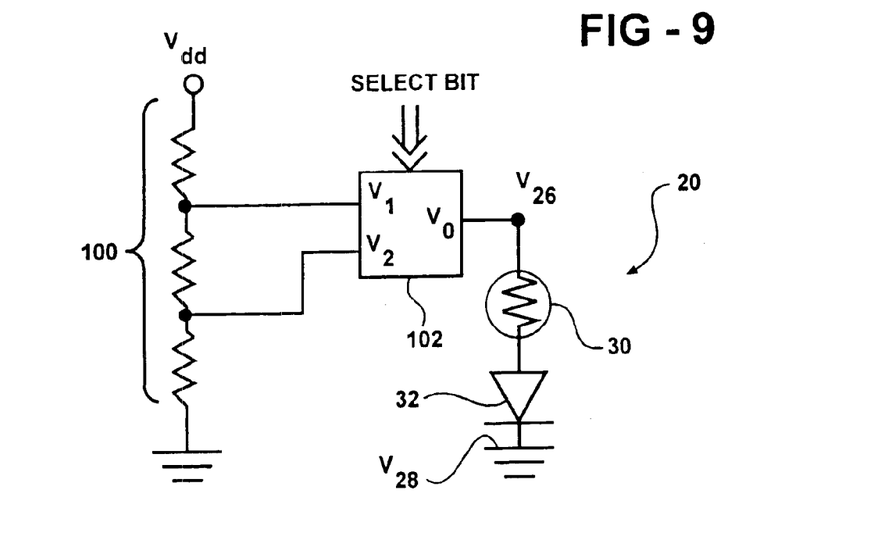
FIG. 9 is a simplified circuit diagram of a circuit illustrating the method of writing to a memory cell in accordance with the present invention.

FIG. 9 is a simplified circuit schematic of one circuit illustrating the principles of the write subroutine of FIG. 5. As seen from FIG. 3, the isolation device 32, in this case a diode, isolates the memory element 30 such that if a voltage applied to the wordline node 26 is greater than a voltage applied to the bitline node 28, there is a potential difference across the memory element 30 resulting is a current flow through the memory element 30 from the wordline 22 to the bitline 24. In FIG. 9 (and FIG. 10, discussed herein), the voltage at the wordline 22, and consequently the wordline node 26, is represented by $V_{26}$, while the voltage at the bitline 24, and consequently the bitline node 28, is represented by $V_{28}$. A voltage divider 100 is connected to the system power supply Vdd, which can be voltage commonly used, such as 5.0 volts or 3.0 volts. The voltage divider 100 comprises a plurality of resistors connected in series. The last resistor in the series is grounded.

A tap between each of the pairs of connected resistors in the voltage divider 100 are provided to a select switch 102. As shown, the voltage divider 100 provides two voltages V1 and V2, but, of course, more than two voltages are possible. The select switch 102 selects the output voltage Vo to be applied at $V_{26}$ in accordance with one or more select bits sent from the processor 19.

In the two-state example provided, the resistors of the voltage divider 100 are chosen so that, when $V_{26}$ is grounded as shown, the voltage V1 applied at $V_{26}$ causes the programming current for the high resistance state determined in step 56 to flow across the memory cell 20, causing the memory element 30 to be programmed to the second, high resistance state. Similarly, the voltage V2 applied at $V_{26}$ causes the programming current for the low resistance state determined in step 56 to flow across the memory cell 20, causing the memory element 30 to be programmed to the first, low resistance state. Which of voltages V1 and V2 are applied across the memory cell 20 is indicated by the SELECT BIT. For example, if the SELECT BIT sent by the processor 19 is a 0 data bit, output voltage Vo of the select switch 102 is the voltage V1, and if the SELECT BIT sent by the processor 19 is a 1 data bit, the output voltage Vo of the select switch 102 is the voltage V2. Using the numbers of the two-state example, a SELECT BIT of 0 causes a programming pulse of 2.8 mA to flow across the memory cell 20 as a result of the voltage potential V1. The memory cell 20 is programmed to a resistance of about 1 MΩ, corresponding to the second resistance state. Similarly, a SELECT BIT of 1 causes a programming pulse of 1.8 mA to flow across the memory cell 20 as a result of the voltage potential V2. The memory cell 20 is programmed to a resistance of about 100 kΩ, corresponding to the first resistance state.

The circuit shown in FIG. 9 is a simplified circuit used to illustrate the principles of the write subroutine according to FIG. 5 with respect to one memory cell 20 and, more specifically, memory element 30. Of course, if the circuit of FIG. 9 is used as the write circuit 15 of FIG. 1, the addressing circuitry 16 is interposed between the write circuit 15 and the memory cell 20 of FIG. 9. For simplicity, the addressing circuitry 16, conventionally connected, is not shown in FIG. 9. The select bit(s), including the SELECT BIT shown in FIG. 9, are sent from the processor 19 to the write circuit in response to the determination of the resistance state 68 to apply the appropriate programming pulse in step 70. The addressing circuitry 16 supplies the voltages $V_{26}$ and $V_{28}$ to the addressed memory cell 20 through the control lines 18.

FIG. 6 shows one read subroutine that may be implemented according to the method according to the present invention. The subroutine starts at step 76 and proceeds to step 78 where initial values are set. For example, the iteration counter i, described in more detail herein, is set equal to 0. Also, all the values from the initialization subroutine of FIG. 4 are obtained. A read command issued from the processor 19 typically includes a read bit attached to a starting address with the size of the data packet that the read command is to retrieve. Here, the read subroutine is described with respect to reading the data from only one memory cell 20, but the routine is performed with respect to each of the memory cells 20 storing data subsequent to the starting address until each memory cell 20 storing data requested by the read command is read. Of course, like the write subroutine of FIG. 5, the reading of data from a memory cell 20 is actually reading the data from the corresponding memory element 30. Further, such reading of data from the memory cells 20 need not be sequential. Like the write subroutine, the memory cells 20 can be read from in any order and can, in some cases, be read from simultaneously.

In step 80, the starting address for the read subroutine is read by the processor 19. The processor 19 transmits the address for the selected memory cell 20 indicated by the starting address to the addressing circuitry 16 in step 82, which transmits the discriminating voltage(s) discussed below to the selected memory cell 20 through the appropriate wordline 22 and bitline 24.

The iteration counter i is incremented by one count in step 84. In step 86, the discriminating voltage is applied for iteration i. That is, in the first iteration, the discriminating voltage for the first iteration is applied. When there exists more than one discriminating voltage, the discriminating voltage for the second iteration is applied, and so on. When there is more than one discriminating voltage, the voltages are preferably sequentially applied to the addressed cell 20 in the plurality of iterations. Herein, they are discussed as being applied from the lowest discriminating voltage to the highest discriminating voltage, by example, but the voltages can be applied in any order to provide the state of the memory element 30 of the addressed cell 20, given the teachings herein. The discriminating voltage for the first iteration is applied in step 86.

The application of a voltage potential in the magnitude of the discriminating voltage across the memory cell 20 generates a current through the memory element 30. The current generated can be read in step 88. When a discriminating voltage is applied to a memory cell 20 programmed with a high resistance value, then the current generated across the memory element 30 and read in step 88 is low. If the discriminating voltage is below the threshold voltage for that memory element 30, the current generated will be below the level at which the memory element 30 switches out of the stable amorphous phase. In contrast, when the same discriminating voltage is applied to a memory cell 20 programmed with a low resistance value, then the current generated across the memory element 30 and read in step 88 is high. A problem can arise because the application of a discriminating voltage in step 86 greater than the threshold voltage Vth may switch the memory element 30 from its reset, amorphous phase to its set, crystalline phase. Specifically, the application of such a discriminating voltage performs a destructive read, that is, the data stored in the memory element 30 is destroyed upon the application of a discriminating voltage above the threshold voltage Vth for the memory element 30.

It is for this reason that the invention contemplates the use of a current limiter, which can limit the current flowing through the memory element 30 upon application of the discriminating voltage. When using a current limiter, the current read in step 88 upon application of a discriminating voltage depends upon the threshold voltage Vth. If the discriminating voltage applied in step 86 is below the threshold voltage Vth, the current generated and read in step 88 is not limited by the current limiter. In contrast, if the discriminating voltage applied in step 86 is below the threshold voltage Vth, the current generated and read in step 88 is limited to the current set by the current limiter. The current set by the current limiter should be low enough not to program the memory element 30. According to the curve of FIG. 7, a current of no more than about 20–30 microamperes ($\mu A$) would not trigger a set of the phase-change material.

Returning now to FIG. 6, the read subroutine proceeds to step 90, where an inquiry is made as to whether the current is limited by the current limiter, or not. If the first discriminating voltage is greater than the threshold voltage Vth, the current read in step 88 is limited by the current limiter upon the application of the first discriminating voltage. The subroutine then proceeds to step 92 where the memory cell 20 contents are reported. For example, in the two-state system, the memory cell 20 contents are reported as corresponding to the low resistance state. The read subroutine then ends at step 94. If, however, the first discriminating voltage is less than the threshold voltage Vth, the current is not limited by the current limiter in step 90. The resistance can be calculated at this point, directly providing a resistance value from which to determine the resistance state. Then, the read subroutine can end in step 94.

The read subroutine according to FIG. 6, however, shows alternative steps. Specifically, when the current is not limited as indicated in step 90, the subroutine proceeds to step 96. In step 96, if the iteration counter i is equal to one less than the number of states, the subroutine proceeds to step 92, where the memory cell 20 contents are reported. In the two-state example, the memory cell 20 contents are reported as corresponding to the high resistance state. The read subroutine then ends at step 94. If, however, the iteration counter i is not equal to one less than the number of states in step 96, it means that there is at least one more discriminating voltage to apply. The subroutine returns to step 84, where the iteration counter is incremented by one count. The remainder of the steps proceed in turn until all of the discriminating voltages are applied across the memory cell 20 in step 96 or until the current is limited by the current limiter in step 90.

A three-state example further illustrates the iterative steps of FIG. 6. The three-state example has first, second and third resistance states, also referred to as low, middle and high resistance states. Because there are three states, there are preferably two discriminating voltages, the first and second discriminating voltages. In the first iteration, as indicated by step 84, the first discriminating voltage is applied in step 86. The current is read in step 88. If the current is limited as indicated by step 90, the contents of the memory cell 20 are reported as corresponding to the low resistance state in step 92 and the read subroutine ends at step 94. If the current is not limited as indicated by step 90, the subroutine advances to step 96. Step 96 indicates that the iteration counter i, one, is not equal to one less than the number of states, i.e., two, so the subroutine returns to step 84, where the iteration counter i is advanced by one count to two. The second discriminating voltage is applied across the memory cell 20 in step 86. The current is read in step 88.

In step 90, the inquiry is made as to whether the current has been limited by the current limiter. If the current limiter is limiting the current as indicated by step 90, the contents of the memory cell 20 are reported as corresponding to the middle resistance state in step 92. The read subroutine then ends at step 94. If, however, the current limiter is not limiting the current as indicated by step 90, the subroutine advances to step 96. Step 96 indicates that the iteration counter i, which is two, is equal to one less than the number of states, which is also two. The subroutine advances to step 92, where the contents of the memory cell 20 are reported as corresponding to the high resistance state. The read subroutine then ends at step 94.

Figure 10:
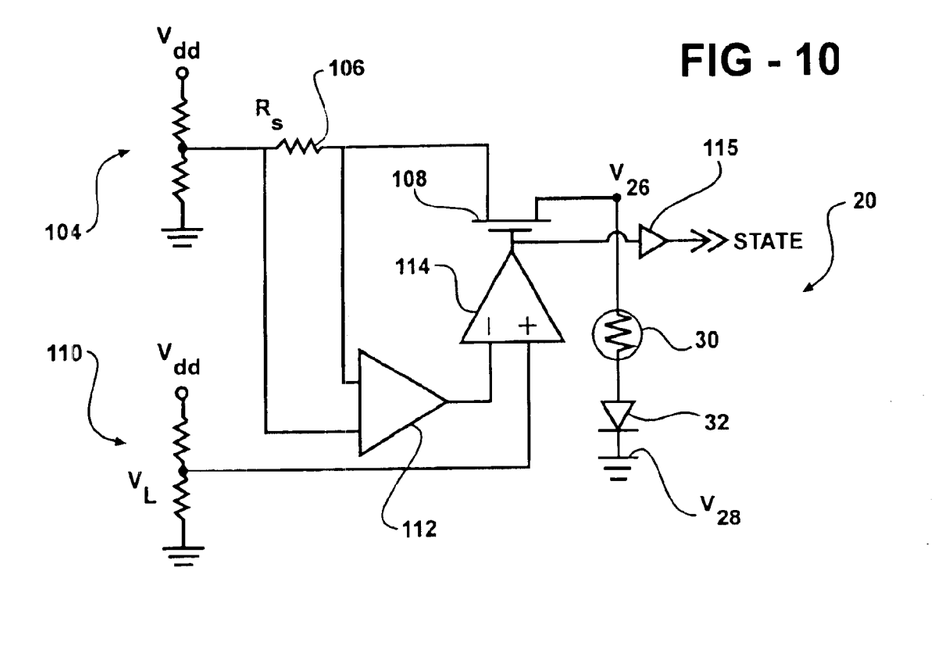
FIG. 10 is a simplified circuit diagram of a circuit illustrating the method of reading from a memory cell in accordance with the present invention.

The circuit of FIG. 10 is a simplified circuit schematic illustrating the principles of the read subroutine of FIG. 6. A voltage divider 104 is connected to the system power supply Vdd, which, as mentioned with respect to FIG. 9, can be voltage commonly used, such as 5.0 volts or 3.0 volts. The voltage divider 104 shown has only two resistors connected in series with the opposed end of the second resistor grounded. A tap between the connected resistors in the voltage divider 104 provides the discriminating voltage at $V_{26}$ where $V_{28}$ is grounded. As shown, the voltage divider 104 only provides one discriminating voltage to the memory cell 20. However, the circuit can easily provide more than one discriminating voltage by the incorporation of additional resistors and taps. Then, like with the voltage divider 100 shown in FIG. 9, a select switch 102 can be incorporated so that the processor 19 can select different discriminating voltages to read the value of the memory cell 20.

The circuit shown in FIG. 10 also includes a sense resistor Rs. The sense resistor 106 senses the current flowing through it and is used as part of the current limiter, as discussed herein. A MOSFET 108 is connected between the sense resistor 106 and the memory cell 20 at the wordline node 26, represented by $V_{26}$. When current flow through the MOSFET 108 is enabled, the voltage at $V_{26}$ should be equal to the discriminating voltage. For example, in the two-state example, the discriminating voltage is 0.75 V. The resistors of the voltage divider 104 should be chosen so that $V_{26}$ is equal to 0.75 V when current flow through the MOSFET 108 is enabled, taking into account the voltage drop across the sense resistor 106 and the MOSFET 108.

A comparator 114 controls the gate of the MOSFET 108, thus controlling the supply of current to the memory cell 20. One input to the comparator 114 is a voltage signal $V_L$. A voltage divider 110 provides the signal $V_L$ to the comparator 114. The signal $V_L$ is a voltage signal that is equivalent to the limiting current, where the limiting current is a current level below the lowest programming current. That is, the value of the limiting current is such that if the limiting current were applied across the memory cell 20, the programmed resistance of the memory cell 20 would not change. The comparator 114 compares the voltage signal $V_L$ to the current flowing across the sense resistor 106. Specifically, the current flowing across the sense resistor 106 is detected and amplified by a differential amplifier 112, the details of which are not shown but are known to those skilled in the art. The output of the differential amplifier 112 is a voltage proportional to the current flowing across the sense resistor 106.

The sense resistor 106, the differential amplifier 112, the comparator 114 and the MOSFET 108 form one simple current limiter for illustrative purposes only. Of course, any number of current limiters can be used. The output of the differential amplifier 112 is compared to the signal $V_L$ by the comparator 114. When the current flowing across the sense resistor 106 is less than the limiting current, as indicated by the output of the comparator 114, the current is not limited by the current limiter. The output of the comparator 114 allows the flow of current through the MOSFET 108 to the memory cell 20. In contrast, when the output of the comparator 114 indicates that the current flowing across the sense resistor 106 is greater than the limiting current, the MOSFET 108 prevents the flow of current to the memory cell 20.

Using the two-state example, whereby one bit is stored in a memory element 30 of a memory cell 20, operation of the circuit of FIG. 10 is explained. As mentioned, the discriminating voltage is 0.75 V where the first resistance state has a threshold voltage of 0.5 V and the second resistance state has a threshold voltage of 1.0 V. According to the read subroutine of FIG. 6, the discriminating voltage of 0.75 V is applied to the memory cell 20. That is, the voltage from the voltage divider 104 is connected to addressed memory cell 20 at $V_{26}$, while $V_{28}$ is grounded. In the example, the limiting current is 20–30 μA, and the resistors of the voltage divider 110 are chosen based upon this current.

Although the current is read across the sense resistor 106, the actual value of the current generated is not necessary to discern the resistance state of the circuit. Instead, in this circuit, the status of the current limiter is used to determine the resistance state. More specifically, if the memory cell 20 is in the low, first resistance state, the application of the discriminating voltage of 0.75 V in step 86 of FIG. 6 results in the current across the memory cell 20 being limited by the current limiter in step 90. Stated in another way, since the threshold voltage for the first resistance state is 0.5 V, a discriminating voltage of 0.75 V causes a current to flow across the sense resistor 106, the current having a magnitude sufficient to switch the memory element 30 of the memory cell 20 from the amorphous phase to the crystalline phase. The differential amplifier 112 amplifies the voltage drop caused by the current, and supplies it to the comparator 114. The comparator 114 compares this voltage to the voltage signal $V_L$. The output of the comparator 114 at the gate of the MOSFET 108 limits (by preventing) the flow of current through the MOSFET 108 to the memory cell 20, preventing the phase change of the memory material and the destruction of the data of the memory cell 20. In FIG. 10, a buffer 115 is tapped at the gate of the MOSFET 108. The output STATE of the buffer 115 indicates that the current is not flowing. This output is used by the processor 19 to determine that the memory cell 20 is programmed to the first resistance state, in the example a logic 0 data bit.

If however, the memory cell 20 is in the high, second resistance state, the application of the discriminating voltage of 0.75 V in step 86 of FIG. 6 results in a very low level of current flowing across the sense resistor 106 and the memory cell 20, less than 1.0 μA where the programmed resistance is about 1.0 MΩ. The small voltage drop across the sense resistor 112 is supplied to the comparator 114 from the differential amplifier 112. The comparator 114 compares this voltage to $V_L$, which is based upon a limiting current of 20–30 μA. The output of the comparator 114 enables the flow of current through the MOSFET 108. The output STATE indicates that the MOSFET 108 is transmitting current. Referring now to FIG. 6, since the current is not limited in step 90, and only one iteration is needed according to step 96, the output STATE of the buffer 115 is used by the processor 19 in step 92 to determine that the memory cell 20 is not programmed to the first resistance state but is programmed to the second resistance state, in the example a logic 1 data bit.

The circuit shown in FIG. 10, as mentioned, is a simplified circuit used to illustrate the principles of the read subroutine according to FIG. 6 with respect to one memory cell 20 and, more specifically, memory element 30. Of course, if the circuit of FIG. 10 is used as the read circuit 17 of FIG. 1, the addressing circuitry 16 is interposed between the read circuit 17 and the memory cell 20 of FIG. 10. For simplicity, the addressing circuitry 16, conventionally connected, is not shown in FIG. 10. The STATE bit for a memory element 30 shown in FIG. 10 is sent to the processor 19 from the read circuit to indicate the state of the memory cell 20. The addressing circuitry 16 supplies the voltages $V_{26}$ and $V_{28}$ to the addressed memory cell 20 through the control lines 18.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

I claim:

1. A method of operating a phase-change memory element, said memory element including a phase-change material, said method comprising:

providing said phase-change memory element including said phase-change material; and programming said phase-change memory element from a first memory state having a first threshold voltage to a second memory state having a second threshold voltage, wherein said phase-change material is in a saturated condition in said first memory state and said second memory state.

2. The method of claim 1, wherein said phase-change material is in an amorphous phase in said first memory state and said second memory state.

3. The method of claim 1, wherein said phase-change material includes a chalcogen element.

4. A method of operating a phase-change memory element, said memory element comprising a phase-change material, said method comprising:

provicing said phase-change memory element including said phase-change material; and programming said phase-change memory element from a first memory state to a second memory state, said phase-change material being in an amorphous phase in said first memory state and said second memory state.

5. The method of claim 4 wherein said phase-change material includes a chalcogen element.

6. A method of reading the current memory state of a phase-change memory element including a phase-change material, said phase-change memory element having at least a first memory state with a first threshold voltage and a second memory state with a second threshold voltage, said method comprising:

providing said phase-change memory element including said phase-change material; and applying a discriminating voltage across said memory element, said discriminating voltage being between said first threshold voltage and said second threshold voltage.

7. The method of claim 6, wherein said phase-change material includes a chalcogen element.

8. An electrically programmable memory element having a plurality of memory states, comprising:

a phase-change material, said phase-change material being in an amorphous phase in each of said memory states.

9. The memory element of claim 8, wherein each of said memory states has a corresponding threshold voltage.

10. The memory element of claim 8, wherein said phase-change material includes a chalcogen element.

11. An electrically programmable memory array, comprising:

a row line;

a column line; and a memory element coupled to said row line and said column line, said memory element having at least a first memory state and a second memory state, said memory element including a phase-change material, said phase-change material being in an amorphous phase in said first memory state and in said second memory state.

12. The memory array of claim 11, wherein said memory element is coupled to said row line or said column line through an isolation device.

13. The memory array of claim 11, wherein said isolation device is selected from the group consisting of diode and transistor.

14. The memory array of claim 11, wherein each of said first memory state has a first threshold voltage and said second memory state has a second threshold voltage.

15. The memory element of claim 11, wherein said phase-change material includes a chalcogen element.

16. An electrically programmable memory element having at least a first memory state and a second memory state, comprising:

a phase-change material wherein said first memory state has a first threshold voltage and said second memory state has a second threshold voltage, wherein said phase-change material is in a saturated condition is said first memory state and said second memory state.

17. The memory element of claim 16, wherein said phase-change material includes a chalcogen element.

18. An electrically programmable memory array, comprising:

a row line;

a column line; and a memory element including a phase-change material, said memory element coupled to said row line and said column line, said memory element having at least a first memory state with a first threshold voltage and a second memory state with a second threshold voltage, wherein said phase-change material is in a saturated condition is said first memory state and said second memory state.

19. The memory array of claim 18, wherein said memory element is coupled to said row line or said column line through an isolation device.

20. The memory array of claim 19, wherein said isolation device is selected from the group consisting of diode and transistor.

21. The memory element of claim 18, wherein said phase-change material includes a chalcogen element.

* * * * *